United States Patent [19]
Giacomo

[11] Patent Number: 6,054,890
[45] Date of Patent: Apr. 25, 2000

[54] ELECTRONIC SWITCHING CIRCUIT WITH REDUCTION OF SWITCHING TRANSIENTS

[75] Inventor: Mazzorin Giacomo, Milan, Italy

[73] Assignee: Ansaldo Sistemi Industriali S.p.A., Italy

[21] Appl. No.: 08/873,543

[22] Filed: Jun. 12, 1997

[30] Foreign Application Priority Data

Jun. 20, 1996 [EP] European Pat. Off. .............. 96830351

[51] Int. Cl.[7] ........................ H03K 17/04; H03K 17/687
[52] U.S. Cl. ........................ 327/375; 327/427; 327/434
[58] Field of Search ................... 327/427, 379, 327/380, 381, 108, 110, 434, 478, 375, 376, 377; 326/26, 27

[56] References Cited

U.S. PATENT DOCUMENTS

| | | | |
|---|---|---|---|
| 5,390,070 | 2/1995 | Niedermeier | 361/152 |
| 5,500,619 | 3/1996 | Miyasaka | 327/427 |
| 5,523,714 | 6/1996 | Topp et al. | 327/427 |
| 5,635,868 | 6/1997 | Aiello et al. | 327/538 |
| 5,650,737 | 7/1997 | Eilley | 327/108 |

FOREIGN PATENT DOCUMENTS

| | | | |
|---|---|---|---|
| 0361211 | 9/1989 | European Pat. Off. | H03K 17/08 |
| 0508171 | 3/1992 | European Pat. Off. | H03K 17/16 |

OTHER PUBLICATIONS

Cordonnier, Charles–Edouard, *Use of the Same MCU I/O Line to Drive A Power MOSFET and to Detect Overload*, Motorola Technical Developments, vol. 16, Aug. 1992, Schamburg, IL, USA.

*Primary Examiner*—Tim Callahan
*Assistant Examiner*—Hai L. Nguyen
*Attorney, Agent, or Firm*—Sofer & Haroun, LLP

[57] ABSTRACT

Electronic circuit including an electronic power switch, for example an IGBT, controlled at its own gate terminal by resistive means in order to reduce its switching speed. The circuit includes a voltage sensor for reading a measurement that is a function of the potential of the collector of the electronic switch, for example its variation over time. The resistive means have a resistance that varies according to the command signal applied to an input terminal of the circuit and to the measurement read by the voltage sensor.

12 Claims, 3 Drawing Sheets

6,054,890

ELECTRONIC SWITCHING CIRCUIT WITH REDUCTION OF SWITCHING TRANSIENTS

TECHNICAL FIELD

The present invention concerns an electronic circuit, and in particular an electronic circuit including an electronic switch.

BACKGROUND OF THE INVENTION

Electronic switches, consisting of a device that can be alternately turned on and turned off, are commonly used in various applications to make and break selectively a connection between two circuit branches in response to a command signal. An example of such applications are the converter circuits that are able to convert a DC voltage into an alternating voltage (inverter) used, for example, in the speed control devices of asynchronous electric motors.

The switching speed of an electronic switch is limited by the fact that, during turn-off and turn-on, i.e. during the passage from the conducting state to the cut-off state and vice versa, a transitory condition of excess voltage (overshoot) occurs across the power terminals of the electronic switch. Switching necessarily involves a high variation over time of the current passing through the device (dI/dt), that in turn generates an excess voltage on the parasitic inductances of the connections, including the connections inside the device. This excess voltage can even be several times higher than that of the electronic switch's power supply and can reach values and durations that cause the safety limits determined by the switch's structural characteristics to be exceeded. It should be noted that, although the problem can be minimised by careful design of the various electrical connections, it cannot be completely eliminated because of the internal inductances of the components themselves. This problem is particularly acute in high power applications, in which the operating voltage may exceed a thousand V and the operating current may reach some thousands of A.

A well-known technique in the state of the art for reducing the effects of this transitory condition (typically used with IGBT, BJT and MOSFET devices) consists of driving the electronic switch with a high resistance by connecting an appropriate resistor to a control terminal thereof. With this arrangement the time constant RC of the input circuit of the electronic switch increases, thus reducing its switching speed and, consequently, the level of voltage overshoot during switching.

However, this known solution, by reducing the switching speed of the electronic switch, prevents the latter from being used in high frequency applications, in which it is made to switch rapidly between its states of conduction and cut-off. In any case, prolonging the switching time causes an increase in dissipated power from the electronic switch during this phase.

Moreover, this solution is not able to limit the voltage overshoots in particular operating situations, such as, for example, in the case in which the electronic switch must be turned off following a short circuit on the load applied to one of its power terminals. It is therefore necessary to use additional protection circuits (clamps, snubbers), with a consequent increase in cost, in complexity and in the space occupied by the electronic switch.

SUMMARY OF THE INVENTION

The object of the present invention is to provide a remedy for the above shortcomings. To achieve this object an electronic circuit is envisaged for selectively breaking and making a connection between a first and a second output terminals, in response to a command signal applied to an input terminal, the circuit including an electronic power switch with a control terminal and first and second power terminals connected to the first and second output terminals respectively, resistive means connected to the control terminal to reduce the switching speed of the switch, a voltage sensor for reading a measurement that is a function of the potential of the first power terminal, the resistive means having a resistance that varies according to the command signal and to the measurement.

The electronic circuit according to the present invention allows reduced switching times to be obtained that do not show great sensitivity to the tolerances of the parameters of the electronic switch while, at the same time, reducing the losses of power during the switching phase.

The solution proposed does not require additional protection circuits (clamps, snubbers), so the resulting circuit is particularly compact, with a consequent reduction in cost and space occupied.

Finally, the circuit according to the present invention ensures a limit to voltage overshoots in any operating condition, including the case where the switch is cut off following a short circuit on the load applied to one of the output terminals.

BRIEF DESCRIPTION OF THE DRAWINGS

Various embodiments of the present invention will now be described by means of examples. The examples provided, which are not exhaustive, make reference to the attached drawings.

DETAILED DESCRIPTION OF THE PREFERRED EMBODIMENTS

Figure 1:
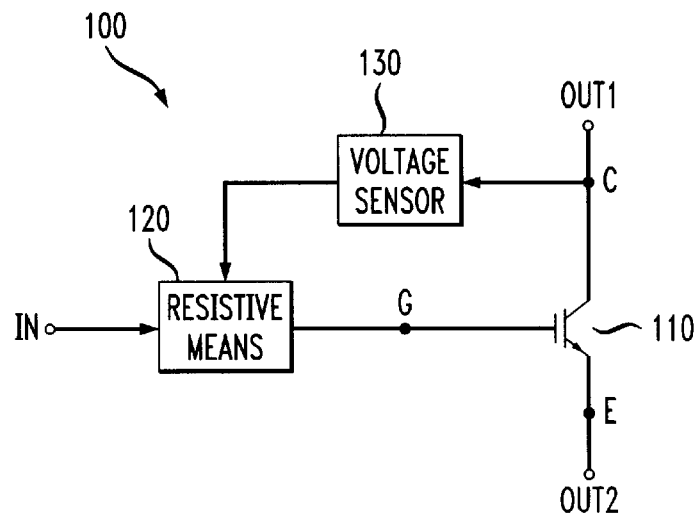
FIG. 1 shows a basic block diagram of an electronic circuit according to the present invention.

With reference now to the figures, and with specific reference to FIG. 1, a basic block diagram is illustrated of an electronic circuit according to the present invention. The circuit 100 allows a connection between two output terminals OUT1 and OUT2 to be opened and closed selectively in response to a command signal, that may assume a turn-on value (ON) or a turn-off value (OFF), applied to an input terminal IN. Typically, the output terminal OUT1 is connected via an inductive load to the positive terminal of a high voltage Vdc power source (that may even be as high as a few thousand V), while the output terminal OUT2 is connected to a reference terminal (earth) that is connected to the negative terminal of the high voltage power source.

The circuit 100 includes an electronic power switch 110 that, in the example illustrated, consists of an insulated-gate bipolar transistor (IGBT); experts in this field will recognise that the switching circuit according to the present invention could also be embodied with other types of electronic power switches (for example metal oxide field-effect transistors (MOSFET), bipolar transistors (BJT) etc.).

The electronic switch 110 has two power terminals, namely a collector terminal C and an emitter terminal E and a control terminal (gate) G; an additional control terminal (not indicated in the figure), namely an auxiliary emitter terminal Ea directly connected to the device chip, is normally used as feedback for the command signal applied to the input terminal IN. The collector terminal C and the emitter terminal E are connected to the output terminal OUT1 and the output terminal OUT2 respectively, while the gate terminal G is connected to the input terminal IN via resistive means 120, in order to reduce the switching speed of the electronic switch 110. When the command signal applied to the input terminal IN assumes the turn-on value (ON), a signal is applied to the gate terminal G such that the IGBT transistor is turned on, thus making the connection between the output terminals OUT1 and OUT2; when the command signal applied to the input terminal IN assumes the turn-off value (OFF), a signal is applied to the gate terminal G such that the IGBT transistor is turned off, thus breaking the connection between the output terminals OUT1 and OUT2.

A voltage sensor 130 is connected by its input terminal to the collector terminal C, while its output terminal is connected to a terminal of the resistive means 120. The voltage sensor 130 is able to read a measurement that it is a function of the potential of the collector terminal (C); typically, the voltage sensor 130 reads the voltage Vc (with respect to earth) of the collector terminal C and/or its variation over time (dV/dt) and outputs a measurement that is a function of this (or these) values read.

The resistive means 120 have a resistance that varies as a function of the value of the command signal applied to the input terminal IN and of the value measured by the voltage sensor 130. Typically, the resistive means 120 assume two resistance values (possibly equal) that correspond with the turn-off signal (OFF) and the turn-on signal (ON) respectively; during the turn-off phase, the resistance of the resistive means 120 initially assumes a first value and then switches to a higher value corresponding to the reaching of a threshold value of the quantity measured by the voltage sensor 130. Preferably, this threshold value consists of a determined value of the variation over time (dV/dt) of the voltage of the collector terminal C, that ensures a better cut-in speed of the voltage sensor 130.

Figure 2:
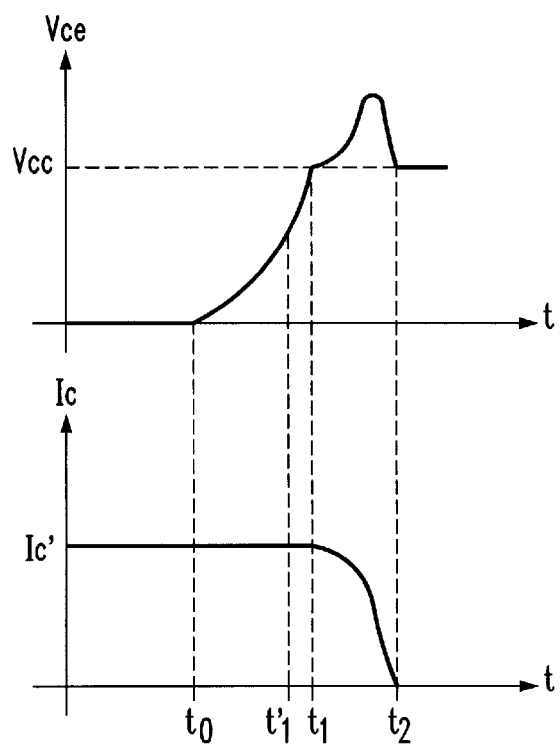
FIG. 2 shows the variation over time of certain electrical quantities of the circuit in FIG. 1 by means of a qualitative time chart.

Regarding this aspect, let us consider the qualitative time chart depicted in FIG. 2 that illustrates the variation over time of certain electrical quantities of the circuit in FIG. 1. Specifically, the first chart shows the variation over time of the voltage Vce between the collector terminal C and the emitter terminal E, while the second chart shows the variation over time of the current Ic flowing through the collector terminal C during a turn-off phase of the electronic switch 110 in FIG. 1.

Let us consider an initial condition in which the electronic switch 110 is on; in this condition, the voltage Vce is practically zero, while a determined current Ic' circulates in the electronic switch. At the instant t0, a turn-off signal is applied to the input terminal IN, thus starting the turn-off phase of the electronic switch 110. The voltage Vce starts to tend towards the value Vdc of the high voltage power supply, while the current Ic stays practically constant. In this phase, the resistance of the resistive means connected to the gate terminal G is low, so that the speed with which the voltage Vce rises over the interval t0–t1 is not compromised.

When the voltage Vce reaches the value Vdc at instant t1, the current Ic starts to diminish and it reaches zero at instant t2. The variation in the current Ic (dI/dt) creates a transitory voltage overshoot between the collector terminal C and the emitter terminal E, whose value is inversely proportional to the duration of the interval t1–t2. At instant t1', that may be adjusted by making an appropriate choice of the values of the various components, the resistance of the resistive means connected to the gate terminal G is raised to a high value, thus slowing down the switching phase t1–t2 with a consequent reduction of the voltage overshoot across the collector C and emitter E terminals. Experts in this field will recognise that the threshold value, at which the resistance value of the resistive means connected to the gate terminal G is modified, can assume a different value from that used in the example described above.

It is observed that the switching circuit in accordance with the present invention reduces the value of dissipated power during the switching phase. In fact the solution proposed limits the time interval t0–t1 in which the power losses (with Ic constant) are directly proportional to the duration of the interval. Prolonging the interval of time t1–t2 does not cause any substantial increase in dissipated power, however, as the latter is only slightly influenced by its duration. In fact, prolonging the interval of time t1–t2 reduces the value of the voltage overshoot produced and therefore that of the instantaneous power dissipated; prolonging the interval of time t1–t2 therefore produces a power dissipation that lasts longer, but that has a lower instantaneous value, without the value of total dissipated energy being substantially modified.

Figure 3:
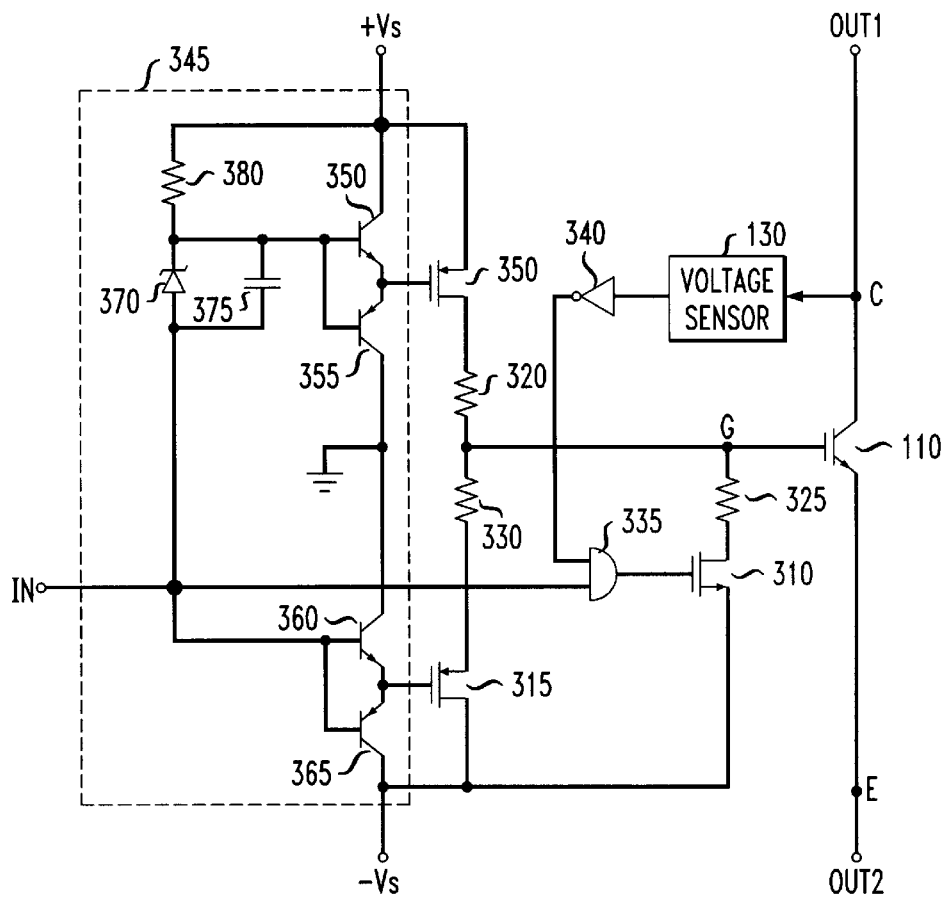
FIG. 3 shows a circuit diagram representing an embodiment of the circuit in FIG. 1.

A circuit diagram corresponding to an embodiment of the circuit in FIG. 1 is shown in FIG. 3 (common elements are indicated by the same symbols or reference numbers). The circuit illustrated has two output terminals OUT1 and OUT2 and an input terminal IN. It includes an electronic switch 110 (made from an IGBT transistor) with a gate terminal G and a collector terminal C and an emitter terminal E connected to the output terminals OUT1 and OUT2 respectively. A voltage sensor 130 is connected by means of its input terminal to the collector terminal C.

The circuit includes a p-channel MOSFET transistor (PMOS) 305 and two n-channel MOSFET transistors (nMOS), 310 and 315 respectively, each with a gate terminal, a source terminal and a drain terminal. The source terminal of the pMOS transistor 305 is connected to a +Vs power supply terminal with a voltage level (with respect to earth) that is equal to a signal for turning on the electronic switch 110 (for example +15 V); the source terminals of the two nMOS transistors 310 and 315 are, on the other hand, connected to a −Vs power supply terminal with a voltage level (with respect to earth) that is equal to a signal for turning off the electronic switch 110 (for example −15 V).

The drain terminal of the pMOS transistor 305 is connected to the gate terminal G of the switch 110 by means of a turn-on resistor 320. The drain terminals of the nMOS transistors 310 and 315 are connected to the gate terminal G of the switch 110 by means of a first turn-off resistor 325 and a second turn-off resistor 330 respectively. The resistor 330 has a higher resistance than that of resistor 325; preferably, the resistance of the resistor 330 is 10 times that of the resistor 325. Typically, the resistances of resistors 320 and 325 are a few Ω, while the resistance of resistor 330 is a few tens of Ω.

The gate terminal of the nMOS transistor 310 is connected to the output terminal of a logical AND gate 335 that has two input terminals connected respectively to the input terminal IN and to the output terminal of a logical NOT gate 340, whose input terminal is connected to the output terminal of the voltage sensor 130.

The gate terminals of the pMOS transistor 305 and of the nMOS transistor 315 are, on the other hand, connected to the input terminal IN by means of a driving circuit 345. Specifically, the nMOS transistor 305 is controlled by means of a first impedance adapter, consisting of a bipolar NPN transistor 350 and a bipolar PNP transistor 355, while the nMOS transistor 310 is controlled by means of a second impedance adapter, consisting of a bipolar NPN transistor 360 and a bipolar PNP transistor 365. In more detail, the gate terminal of the pMOS transistor 305 is connected to the emitter terminals of the two bipolar transistors 350 and 355. The collector terminal of the NPN transistor 350 is connected to the +Vs power supply terminal, while the collector terminal of the PNP transistor 355 is connected to a reference power supply terminal (earth); the base terminal of the NPN transistor 350 is connected to the base terminal of the PNP transistor 355. Similarly, the gate terminal of the nMOS transistor 315 is connected to the emitter terminals of the two bipolar transistors 360 and 365. The collector terminal of the NPN transistor 360 is connected to the earth terminal, while the collector terminal of the PNP transistor 365 is connected to the −Vs power supply terminal; the base terminal of the NPN transistor 360 is connected to the base terminal of the PNP transistor 365.

Moreover, the driving circuit 345 includes a Zener diode 370 whose anode is connected to the input terminal IN and whose cathode is connected to the connection point of the base terminals of the two transistors 350 and 355. A capacitor 375 is connected in parallel with the Zener diode 370, while a resistor 380 is connected between the cathode of the Zener diode 370 and the +Vs power supply terminal. The circuit block consisting of the Zener diode 370, the capacitor 375 and the resistor 380 forms a shifter of the level of the command signal applied to the input terminal IN; in fact, the capacitor 375 maintains a voltage across its terminals that is equal to the reverse threshold voltage of the Zener diode 370 (e.g. 15 V).

The switching circuit illustrated in the figure switches between its two turn-off and turn-on states in response to a command signal applied to the input terminal IN. Specifically, the ON signal consists of a logical 0 signal, equal to −Vs, while the OFF signal consists of a logical 1 signal, equal to 0 V.

The shifter block 370, 375, 380 shifts the command signal applied to the input terminal IN, in a range between the ON value (−Vs) and the OFF value (0 V), to a shifted command signal in a range between a shifted ON value (0 V) and a shifted OFF value (+Vs). This shifted command signal is applied to the gate terminal of the pMOS transistor 305 via the impedance adapter 350, 355, so that the transistor is correctly driven and so that the application of too high a voltage difference across its gate and source terminals is avoided, as this could destroy the component.

With a view to describing the operation of the switching circuit illustrated in the figure, let us suppose that an ON signal (−Vs) with logical value 0 is applied to the input terminal IN. The impedance matching circuit consisting of the bipolar transistors 360 and 365 transfers this signal to the gate terminal of the nMOS transistor 315. Specifically, the NPN transistor 360 is cut off, while the PNP transistor 365 conducts, so that the gate terminal of the nMOS transistor 315 is connected to the −Vs power supply terminal. In this situation, the nMOS transistor 315 is cut off. The logical 0 signal applied to the logical AND gate 335 outputs a logical value of 0 (independently of the value detected by the voltage sensor 130), i.e. equal to −Vs, so that the nMOS transistor 310 is also cut off.

The shifter block 370, 375, 380 shifts the ON signal −Vs to 0 V and this is then applied to the base terminals of the bipolar transistors 350 and 355. This value is transferred from the impedance matching circuit consisting of the bipolar transistors 350 and 355 to the gate terminal of the pMOS transistor 305. Specifically, the NPN transistor 350 is cut off, while the PNP transistor 355 conducts, so that the gate terminal of the pMOS transistor 305 is connected to the earth terminal (0 V). In this situation, the pMOS transistor 305 conducts. The gate terminal G of the electronic switch 110 is thus connected to the +Vs power supply terminal by means of the turn-on resistor 320; the switch 110 is then turned on with a turn-on time defined by the resistance of resistor 320.

Let us now suppose that an OFF signal (0 V), with a logical value of 1, is applied to the input terminal IN. The shifter block 370, 375, 380 shifts the OFF signal of 0 V to a level of +Vs and this is then applied to the base terminals of the bipolar transistors 350 and 355. This value is transferred from the impedance matching circuit consisting of the bipolar transistors 350 and 355 to the gate terminal of the pMOS transistor 305. Specifically, the PNP transistor 355 is cut off, while the NPN transistor 350 conducts, so that the gate terminal of the pMOS transistor 305 is connected to the power supply terminal +Vs. In this situation, the pMOS transistor 305 is cut off.

The impedance matching circuit consisting of the bipolar transistors 360 and 365 transfers the turn-off signal (0 V) to the gate terminal of the nMOS transistor 315. Specifically, the PNP transistor 365 is cut off, while the NPN transistor 360 conducts, so that the gate terminal of the nMOS transistor 315 is connected to the earth terminal (0 V). In this situation, the nMOS transistor 315 conducts.

Moreover, the logical 1 signal is applied to an input terminal of the logical AND gate 335. In the initial phase of switching, the voltage sensor 130 outputs a logical value of 0; the logical NOT circuit 340 thus applies a logical 1 signal to the other input terminal of the logical AND gate 335. The logical AND gate 335 thus produces a logical value of 1 (i.e. 0 V) on its output terminal and this is applied to the gate terminal of the nMOS transistor 310. In this situation, the nMOS transistor 315 also conducts.

The gate terminal G of the electronic switch 110 is thus connected to the −Vs power supply terminal by means of the parallel setup of the two resistors 325 and 330; theoretically, if the resistance of the resistor 330 is much higher than the resistance of the resistor 325 (e.g. 10 times greater), this parallel setup has a resistance that is practically equal to that of resistor 325. The switch 110 is thus controlled in the initial phase of turn-off by means of a resistor with a low resistance.

When the quantity measured by the voltage sensor 130 reaches a predetermined threshold value (instant t1' in FIG. 2), the voltage sensor 130 outputs a logical value of 1 that is negated by the logical NOT gate 320 and input to the logical AND gate 335, making its output assume a logical value of 0 (i.e. −Vs); in this situation the nMOS transistor 310 is cut off. The gate terminal G of the electronic switch 110 is thus connected to the −Vs power supply terminal by means of the high-resistance resistor 330 alone. The switch 110 is thus controlled during the critical phase of turn-off by means of a resistor with a high resistance.

Experts in the field will recognise that the switching circuit described above can be embodied in dual mode by substituting the nMOS transistors with pMOS transistors and vice versa, or by substituting certain of the MOS transistors with appropriate NPN and PNP bipolar transistors.

Figure 4:
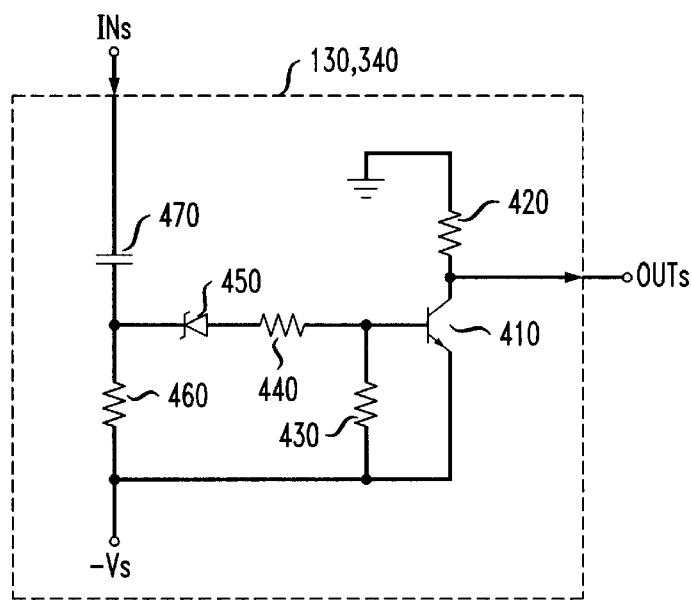
FIG. 4 illustrates an embodiment of the voltage sensor included in the circuit of FIG. 3.

In FIG. 4 an embodiment of the voltage sensor 130 and the logical NOT gate 340 included in the circuit in FIG. 3 is depicted. Block 130–340 has an input terminal INs (connected in the example of FIG. 3 to the collector terminal C of the electronic switch 110) and an output terminal OUTs (connected in the example of FIG. 3 to the input terminal of the logical AND gate 335).

The block 130–340 includes an NPN bipolar transistor 410 with a collector terminal, an emitter terminal and a base terminal. The collector terminal is connected to the output terminal OUTs; the same collector terminal is connected to the earth terminal by means of a resistor 420. The emitter terminal is connected to the −Vs power supply terminal; a resistor 430 is connected across the base terminal and the emitter terminal of the transistor 410. The base terminal of transistor 410 is connected to the anode of a Zener diode 450 by means of a resistor 440. The cathode of the Zener diode 450 is connected to the −Vs power supply terminal by means of a resistor 460 and is connected to the input terminal INs of the voltage sensor 130 by means of a capacitor 470.

With a view to describing the operation of block 130–340, let us consider an initial condition in which the transistor 410 is cut off, so that the output terminal OUTs is connected to the earth terminal (0 V); in this situation, the output of block 130–340 assumes the logical value of 1.

It can now be observed that the capacitor 470 and the resistor 460 constitute a differentiator circuit that produces a voltage drop across resistor 460 that is proportional to the derivative over time of the voltage applied to the input terminal Ins (dV/dt). When the quantity dV/dt reaches a threshold value that causes a drop in voltage across resistor 460 that is greater than a value such as to invert conduction through the Zener diode 450, a current starts to circulate in the loop formed by the Zener diode 450 and by the resistors 430, 440 and 460 that causes a drop in voltage across resistor 430 such that the NPN transistor 410 starts to conduct and, as a result, the output terminal OUTs is connected to the −Vs power supply terminal; in this situation, the output of block 130–340 (voltage sensor 130 and logical NOT gate 340) assumes the logical value of 0.

It should be noted that the voltage sensor described above can be embodied in dual mode by substituting the NPN transistor with a PNP transistor or with a field-effect transistor, either nMOS or pMOS.

Figure 5:
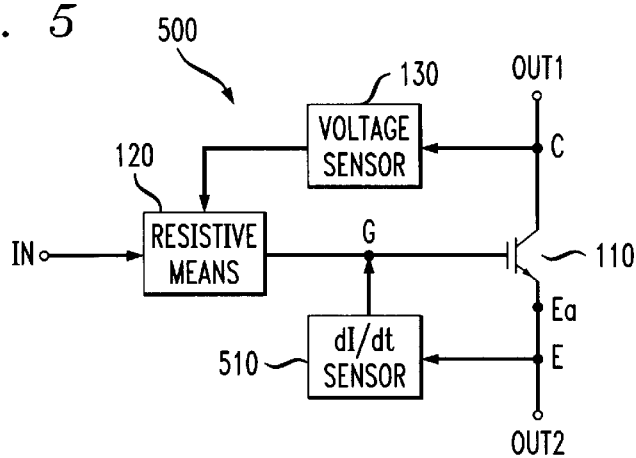
FIG. 5 is a block diagram of an alternative embodiment of the present invention.

With reference now to FIG. 5, a block diagram is presented of an alternative embodiment of the present invention. The circuit illustrated includes, in addition to the scheme described with reference to FIG. 1 (whose common elements are indicated with the same reference numbers), an additional sensor 510 connected by its input terminal to the emitter terminal E, while its output terminal is connected to the gate terminal G. The sensor 510 is capable of taking a measurement that indicates the current variation overtime (dI/dt) through the emitter terminal E; the sensor 510 permits the value of the signal applied to the gate terminal G to be varied according to the value it has measured. Specifically, the sensor 510 varies the signal applied to the gate terminal G such that the turn-on phase of the switch 110 (command signal ON) is slowed down when the absolute value of the measured current variation over time (dI/dt) exceeds a determined threshold value; vice versa, the sensor 510 varies the signal applied to the gate terminal G such that the turn-off phase of the switch 110 (command signal OFF) is slowed down when the absolute value of the measured current variation over time (dI/dt) exceeds another threshold value.

This solution permits direct control of the current variation (dI/dt) through the electronic switch during both switching phases (turn-on and turn-off) of the switching circuit; it therefore has the advantage of providing a limit to this variation which is independent of the temperature, of the characteristics of individual components and of the value of the current to be switched.

This solution is particularly advantageous when several circuits of the type described above have to be connected in parallel. In fact it permits the differences of the switching times prevailing between the various components to be compensated, thus reducing the asymmetry of current distribution among the various electronic switches.

Figure 6:
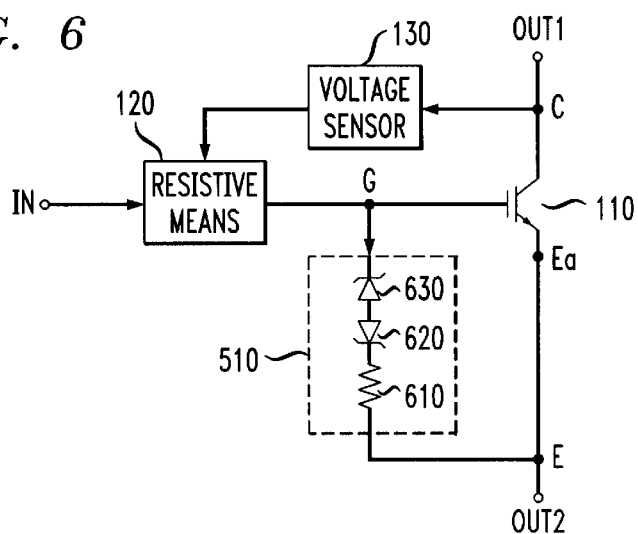
FIG. 6 is a circuit diagram representing an embodiment of the additional sensor included in the circuit of FIG. 5.

A circuit diagram corresponding to an embodiment of this additional sensor is illustrated in FIG. 6. The sensor 510 consists of a resistor 610 and two Zener diodes 620 and 630 connected in series between the emitter terminal E and the gate terminal G, with the two Zener diodes 620 and 630 connected in opposition to each other. Specifically, the resistor 610 is connected to the emitter terminal E and to the cathode of the Zener diode 620; the anode of the Zener diode 620 is connected to the anode of the Zener diode 630, whose cathode is connected to the gate terminal G.

Ea in the figure indicates the auxiliary emitter terminal of the electronic switch 110, normally used as feedback for the command signal applied to the input terminal IN. Since there is only an internal connection of switch 110, characterised by a low value of inductance, placed between the auxiliary emitter terminal Ea and the emitter terminal E, the voltage difference across the two terminals Ea and E is directly proportional to the value of the current variation over time (dI/dt) at the emitter terminal E.

Let us now suppose that a turn-on signal (ON) is applied to the input terminal IN. During the turn-on phase of the electronic switch 110, the current variation over time (dI/dt) is positive, so that the auxiliary emitter terminal Ea goes to a higher potential than that of the emitter terminal E. When the current variation dI/dt produces a potential difference between terminals E and Ea that causes reverse conduction in Zener diode 630, a current starts to circulate in sensor 510 in the direction indicated in the figure. This current, whose value depends on the resistance of resistor 610 (typically a few Ω), slows down the turn-on phase of the switch 110.

Let us now suppose that a turn-off signal (OFF) is applied to the input terminal IN. During the turn-off phase of the electronic switch 110, the current variation over time (dI/dt) is negative, so that the auxiliary emitter terminal Ea goes to a lower potential than that of the emitter terminal E. When the current variation dI/dt produces a potential difference between terminals E and Ea that causes reverse conduction in Zener diode 620, a current starts to circulate in sensor 510 in the opposite direction to the one indicated in the figure. This current slows down the turn-off phase of the switch 110.

The combination of sensor 510 with the solution illustrated in FIG. 1 allows the advantages offered by the direct control of the current variation (dI/dt) across the electronic switch to be fully exploited. The actual effectiveness of the solution provided by the sensor 510 is in fact conditioned by the speed of response of the electronic switch 110. To obtain a good effect, the resistance of the resistor 610 would need to be lowered; the extent to which this can be done is however limited by the maximum voltage that may be applied to the gate terminal G. As described previously with reference to FIG. 2, control of the resistance of the resistive means 120 occurs before the critical phase in which the negative current variation (dI/dt) is established. In this way, the Zener diode 620 is turned on when the gate terminal G is already preloaded and the response of the electronic switch 110 is therefore swift. The effect of slowing down switching of the switch 110 is therefore obtained without the need to apply voltages to the gate terminal G that are too high.

Figure 7:
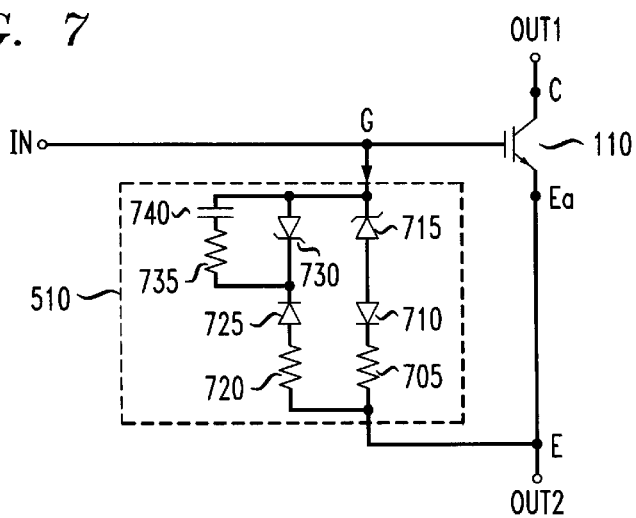
FIG. 7 is a circuit diagram of a preferred embodiment of this additional sensor.

In FIG. 7 a circuit diagram is depicted of a preferred embodiment of the sensor 510. The sensor 510 consists of two parallel circuit branches connected across the emitter E and gate G terminals. The circuit branch that is active during the turn-on phase consists of a resistor 705, a diode 710 and a Zener diode 715 connected in series, in such a way that, during the phase when diode 710 is forward-conducting and Zener diode 715 is reverse-conducting, the current in the circuit branch 705, 710, 715 flows from gate terminal G to emitter terminal E. Specifically, the resistor 705 is connected between the emitter terminal E and the cathode of diode 710; the anode of diode 710 is connected to the anode of Zener diode 715, whose cathode is connected to the gate terminal G.

The circuit branch that is active during the turn-off phase consists of a resistor 720, a diode 725 and a Zener diode 730 connected in series in such a way that, during the phase when diode 725 is forward-conducting and Zener diode 730 is reverse-conducting, the current in the series setup 720, 725, 730 flows from emitter terminal E to gate terminal G. Specifically, the resistor 720 is connected between the emitter terminal E and the anode of diode 725; the cathode of the diode 725 is connected to the cathode of the Zener diode 730, whose anode is connected to the gate terminal G. A resistor 735 and a capacitor 740, connected together in series, are connected in parallel with the Zener diode 730. The circuit block consisting of the Zener diode 730, the resistor 735 and the capacitor 740 constitutes a voltage shifter; in fact the capacitor 740 maintains a voltage across its terminals that is equal to the reverse threshold voltage of the Zener diode 730 (e.g. 15 V).

Let us now suppose that a turn-on signal (ON) is applied to the input terminal IN, so that the auxiliary emitter terminal Ea attains a higher potential than that of the emitter terminal E. In this situation, the diode 725 is reverse biased and the circuit branch 720–740 is therefore broken. The diode 710, on the other hand, is forward biased; when the current variation dI/dt produces a voltage difference between terminals E and Ea that causes reverse conduction in the Zener diode 715 (e.g. with a reverse threshold voltage of 15 V), a current starts to circulate in the circuit branch 705–715, in the direction indicated in the figure. This current, whose value depends on the resistance of resistor 705 (typically a few Ω), slows down the turn-on phase of the switch 110.

Let us now suppose that a turn-off signal (OFF) is applied to the input terminal IN, so that the auxiliary emitter terminal Ea attains a lower potential than that of the emitter terminal E. In this situation, diode 710 is reverse biased and the circuit branch 705–715 is therefore broken. As soon as the current variation dI/dt produces a voltage difference between terminals E and Ea that causes forward conduction in diode 725 (typically with a threshold voltage of 0.6 V), a current starts to circulate in the circuit branch consisting of resistor 720, diode 725, resistor 735 and capacitor 740, in the direction indicated in the figure; it is noted that the voltage shifter 730–740 permits a lower threshold value to be used to cut-in the circuit branch 720–740 while maintaining a voltage difference of corrected value between the emitter E and gate G terminals. Subsequently, when the current variation dI/dt produces a voltage difference between terminals E and Ea that causes the Zener diode 730 to reach its reverse threshold voltage (e.g. 15 V), the Zener diode 730 also begins reverse-conducting. The current in this circuit branch, whose value depends substantially on the resistance of resistor 720 (typically a few Ω), slows down the turn-off phase of the switch 110.

In this embodiment, the threshold value used by sensor 510 during the turn-off phase is consequently lower (in absolute value) than the threshold value used in the embodiment described by FIG. 6; this advantageously permits this solution to be used, even in isolation, independently of that illustrated in FIG. 1.

What is claimed is:

1. Electronic circuit for selectively breaking and making a connection between a first and a second output terminals in response to a command signal applied to an input terminal, the circuit including:

an electronic power switch with a control terminal and first and second power terminals that are connected respectively to the first and second output terminals;

a voltage sensor coupled to said power switch for providing a measurement value that is a function of the potential of the first power terminal; and a variable resistive means responsive to said command signal, said resistive means connected to the control terminal for reducing the switching speed of the switch, the resistance value of said resistive means varying in response to said input signal and said voltage sensor measurement value.

2. Circuit according to claim 1, in which said measurement value is indicative of the speed of variation of the potential of the first power terminal as a function of time.

3. Circuit according to claim 1, in which the resistive means assume a first resistance value when the command signal has a turn-on value, a second resistance value when the command signal has a turn-off value and said measurement is lower than a threshold value and a third resistance value when the command signal has the turn-off value and said measurement is equal to or higher than the threshold value, the third resistance value being higher than the second resistance value.

4. Circuit according to claim 3, in which the resistive means include a first transistor of a first type and a second and a third transistor of a second type, each of which has a control terminal and first and second terminals, the first terminal of the first transistor being connected to a first power supply terminal with a voltage level equal to a turn-on signal of the switch and the first terminal of the second and third transistor being connected to a second power supply terminal with a voltage level equal to a turn-off signal of the switch, a first, a second and a third resistor connected between the command terminal of the switch and the second terminal of the first, the second and the third transistors respectively, a driving circuit with an input terminal connected to the input terminal of the circuit, a first and a second output terminal connected to the control terminal of the first and the third transistors respectively, that serves to turn on the first transistor and to cut off the third transistor when the command signal has the turn-on value and to cut off the first transistor and to turn on the third transistor when the command signal has the turn-off value, logic means with first and second input terminals connected to the output terminal of the voltage sensor and to the input terminal of the circuit respectively and an output terminal connected to the control terminal of the second transistor in order to turn on the second transistor only when the command signal has the turn-off value and said measurement is lower than the threshold value.

5. Circuit according to claim 4, in which the logic means include a logical AND gate with a first input terminal connected to the input terminal of the circuit, a second input terminal connected via a logical NOT gate to the output terminal of the voltage sensor and an output terminal connected to the control terminal of the second transistor, the voltage sensor producing a logical value of 0 on its output terminal when said measurement is lower than the threshold value and a logical value of 1 when said measurement is equal to or higher than the threshold value, the turn-on value and the turn-off value of the command signal corresponding to the logical values 0 and 1 respectively.

6. Circuit according to claim 4, in which the voltage sensor includes a fourth transistor with a control terminal, a first terminal connected to the second power supply terminal and a second terminal connected to the output terminal of the voltage sensor and, by means of a fourth resistor, to a third power supply terminal with a voltage level equal to the turn-off value, a fifth resistor connected between the control terminal and the first terminal of the fourth transistor, a series setup consisting of a sixth resistor and a first Zener diode, said series setup having a first terminal connected to the control terminal of the fourth transistor and a second terminal connected to the second power supply terminal and to the input terminal of the voltage sensor by means of a seventh resistor and a first capacitor respectively.

7. Circuit according to claims 1, including an additional sensor for taking an additional measurement indicative of a current variation over time on the second power terminal and for varying the value of a signal applied to the control terminal of the switch according to said additional measurement.

8. Circuit according to claim 7, in which the additional sensor varies the signal applied to the control terminal in order to slow down the turn-on of the switch when the command signal has the turn-on value and said additional measurement is higher in absolute value than a first additional threshold value, and in order to slow down turn-off of the switch when the command signal has the turn-off value and said additional measurement is higher in absolute value than a second additional threshold value.

9. Circuit according to claim 8, in which the additional sensor includes an eighth resistor, a second and a third Zener diode connected in series between the control terminal and the second power terminal of the switch, the second and the third Zener diode being in opposition to one another.

10. Circuit according to claim 8, in which the second additional threshold value is lower in absolute value than the first additional threshold value.

11. Circuit according to claim 10, in which the additional sensor includes a first and a second circuit branch that are connected in parallel between the control terminal and the second power terminal of the switch, the first circuit branch including a ninth resistor, a first diode and a fourth Zener diode connected in series so that when the first diode is forward biased and the fourth Zener diode is reverse biased, the current in said first circuit branch flows from the control terminal to the second power terminal of the switch, the second circuit branch including a tenth resistor, a second diode and a fifth Zener diode connected in series so that when the second diode is forward biased and the fifth Zener diode is reverse biased, the current in said second circuit branch flows from the second power terminal to the control terminal of the switch, an eleventh resistor and a second capacitor being connected together in series and in parallel with the fifth Zener diode.

12. Circuit according to claims 1, in which the switch is an IGBT transistor, the control terminal being a gate terminal and the first and second power terminals being a collector terminal and an emitter terminal respectively.

* * * * *